United States Patent
Takada et al.

(10) Patent No.: US 9,692,441 B2
(45) Date of Patent: Jun. 27, 2017

(54) AD CONVERTER AND AD CONVERSION METHOD

(71) Applicant: Renesas Electronics Corporation, Tokyo (JP)

(72) Inventors: Hiroki Takada, Tokyo (JP); Atsushi Tangoda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/137,233

(22) Filed: Apr. 25, 2016

(65) Prior Publication Data

US 2017/0005668 A1    Jan. 5, 2017

(30) Foreign Application Priority Data

Jun. 30, 2015  (JP) ................................ 2015-130765
Aug. 13, 2015  (JP) ................................ 2015-159767

(51) Int. Cl.
*H03M 1/12*      (2006.01)
*H03M 1/46*      (2006.01)

(52) U.S. Cl.
CPC ............ *H03M 1/46* (2013.01); *H03M 1/468* (2013.01); *H03M 1/12* (2013.01)

(58) Field of Classification Search
CPC ........ H03M 1/468; H03M 1/804; H03M 1/46; H03M 1/12; H03M 1/466; H03M 1/38; H03M 1/1038; H03M 1/403
USPC ................. 341/118, 120, 155, 172
See application file for complete search history.

(56) References Cited

U.S. PATENT DOCUMENTS

| | | | | |
|---|---|---|---|---|
| 4,907,514 A | * | 3/1990 | Wicks ..................... | B60G 5/02 105/215.2 |
| 4,970,514 A | * | 11/1990 | Draxelmayr ........ | H03M 1/1042 324/130 |
| 5,684,487 A | * | 11/1997 | Timko ................ | H03M 1/1047 341/120 |
| 6,400,302 B1 | * | 6/2002 | Amazeen ................ | H03M 1/68 341/150 |
| 6,433,724 B1 | * | 8/2002 | Confalonieri ......... | H03M 1/068 341/155 |

(Continued)

FOREIGN PATENT DOCUMENTS

JP        2014-011768 A      1/2014

*Primary Examiner* — Linh Nguyen
(74) *Attorney, Agent, or Firm* — Mattingly & Malur, PC

(57) ABSTRACT

A successive approximation ADC capable of reducing deterioration in AD conversion accuracy due to noise is provided. An AD converter according to an embodiment includes: a DA converter that generates a comparison voltage based on a sampling value obtained by sampling an analog signal, and a successive approximation control signal; a reference voltage generation circuit that generates a reference voltage used for the successive approximation process; a comparator that compares the comparison voltage with the reference voltage and outputs a successive approximation result; a successive approximation processing unit that generates the successive approximation control signal based on the successive approximation result; and a storage unit that stores an expected value of the AD conversion process. The reference voltage generation circuit generates the reference voltage based on the expected value stored in the storage unit.

10 Claims, 12 Drawing Sheets

(56) References Cited

U.S. PATENT DOCUMENTS

| | | | | |
|---|---|---|---|---|
| 6,559,789 B1* | 5/2003 | Somayajula | ............ | H03M 1/462 341/155 |
| 6,809,674 B1* | 10/2004 | Ramsden | ............ | H03M 1/1225 341/141 |
| 7,038,609 B1* | 5/2006 | Hurrell | ............ | H03M 1/145 341/156 |
| 8,547,270 B1* | 10/2013 | Strode | ............ | H03M 1/1061 341/155 |
| 2011/0215956 A1* | 9/2011 | Ishikawa | ............ | H03M 1/00 341/110 |
| 2013/0027233 A1* | 1/2013 | Nozaki | ............ | H03M 1/12 341/118 |
| 2013/0088375 A1* | 4/2013 | Wu | ............ | H03M 1/1047 341/120 |
| 2015/0061904 A1* | 3/2015 | Lee | ............ | H03M 1/1023 341/118 |

\* cited by examiner

AD CONVERTER AND AD CONVERSION METHOD

CROSS-REFERENCE TO RELATED APPLICATIONS

This application is based upon and claims the benefit of priority from Japanese patent applications No. 2015-130765, filed on Jun. 30, 2015, and No. 2015-159767, filed on Aug. 13, 2015, the disclosure of which is incorporated herein in their entirety by reference.

BACKGROUND

The present invention relates to an AD converter and an AD conversion method. For example, the present invention relates to a successive approximation AD converter and a successive approximation AD conversion method.

A successive approximation ADC is known as an AD (Analog/Digital) converter (ADC) that converts an input analog signal into a digital signal. The successive approximation ADC samples an input analog signal, performs a successive approximation process on a sampling value, and outputs a digital signal representing the successive approximation result.

Semiconductor devices having the ADC mounted thereon are widely used for, for example, control devices and sensors for vehicles. In such semiconductor devices, there is a demand for reducing the number of external terminals to satisfy the demand for miniaturization. In order to reduce the number of external terminals, a technique for sharing a power supply terminal for supplying a power supply voltage, a reference voltage, and the like has been developed. Such semiconductor devices, however, have a problem that the AD conversion accuracy deteriorates due to reference noise.

Measures for reducing the effect of noise in the successive approximation ADC have been conventionally studied (for example, Japanese Unexamined Patent Application Publication No. 2014-11768). A successive approximation ADC disclosed in Japanese Unexamined Patent Application Publication No. 2014-11768 includes a DA (Digital/Analog) converter (DAC), a comparator, a successive approximation register (SAR) logic unit, and a reference voltage generation circuit.

The DAC has a function for sampling an input analog signal, and includes a plurality of capacitor elements charged during the sampling process. The comparator performs successive approximation of the output of the DAC and the output of the reference voltage generation circuit, and calculates a digital signal to be output. The successive approximation logic unit includes a successive approximation register, and the value of the successive approximation register is overwritten according to the comparison result of the comparator.

During the successive approximation process, the plurality of capacitor elements are connected to a high-side reference voltage or a low-side reference voltage according to the value of the successive approximation register, and a comparison voltage used for the subsequent successive approximation process is generated. When the digital value (code value) output from the successive approximation AD converter is large, the number of capacitor elements connected to the high-side reference voltage increases. When the code value is small, the number of capacitor elements connected to the low-side reference voltage increases.

A reference voltage generation circuit having a general configuration includes one capacitor element connected only to the low-side reference voltage. Accordingly, the reference voltage generation circuit having a general configuration has noise sensitivity characteristics related only to the low-side reference voltage. For this reason, the difference between the amount of noise generated in the output of the DAC and the amount of noise generated in the output of the reference voltage generation circuit increases as the code value increases.

On the other hand, in Japanese Unexamined Patent Application Publication No. 2014-11768, the reference voltage generation circuit includes a first capacitor element connected to the high-side reference voltage, and a second capacitor element connected to the low-side reference voltage. Accordingly, the reference voltage generation circuit disclosed in Japanese Unexamined Patent Application Publication No. 2014-11768 has noise sensitivity characteristics related to both the high-side reference voltage and the low-side reference voltage. Thus, even when the code value increases, the difference between the amount of noise generated in the output of the DAC and the amount of noise generated in the output of the reference voltage generation circuit can be reduced.

SUMMARY

In Japanese Unexamined Patent Application Publication No. 2014-11768, the reference voltage generation circuit includes two capacitor elements which are connected to the high-side reference voltage and the low-side reference voltage, respectively. Accordingly, in the configuration disclosed in Japanese Unexamined Patent Application Publication No. 2014-11768, the maximum value of the difference in the amount of noise can be reduced to half of the maximum value of the difference in the amount of noise in the general configuration. However, the configuration disclosed in Japanese Unexamined Patent Application Publication No. 2014-11768 has a problem that the difference in the amount of noise cannot be reduced to less than half of the difference in the amount of noise in the general configuration.

Other objects and novel features of the present invention will become apparent from the following description and the accompanying drawings.

A first aspect of the present invention is an AD converter that performs a sampling process and a successive approximation process on an analog signal, executes an AD conversion process, and outputs an AD conversion result. In the AD converter, a reference voltage is generated based on an expected value of the AD conversion process, and the reference voltage is supplied to a comparator that performs the successive approximation process.

Even when the device according to the first aspect is replaced by a method, a system, a program for causing a computer to execute the device or apart of processing of the device, or a semiconductor device including the device, it can still be effective as one aspect of the present invention.

According to the first aspect, it is possible to provide a successive approximation AD converter capable of reducing deterioration in AD conversion accuracy due to noise.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
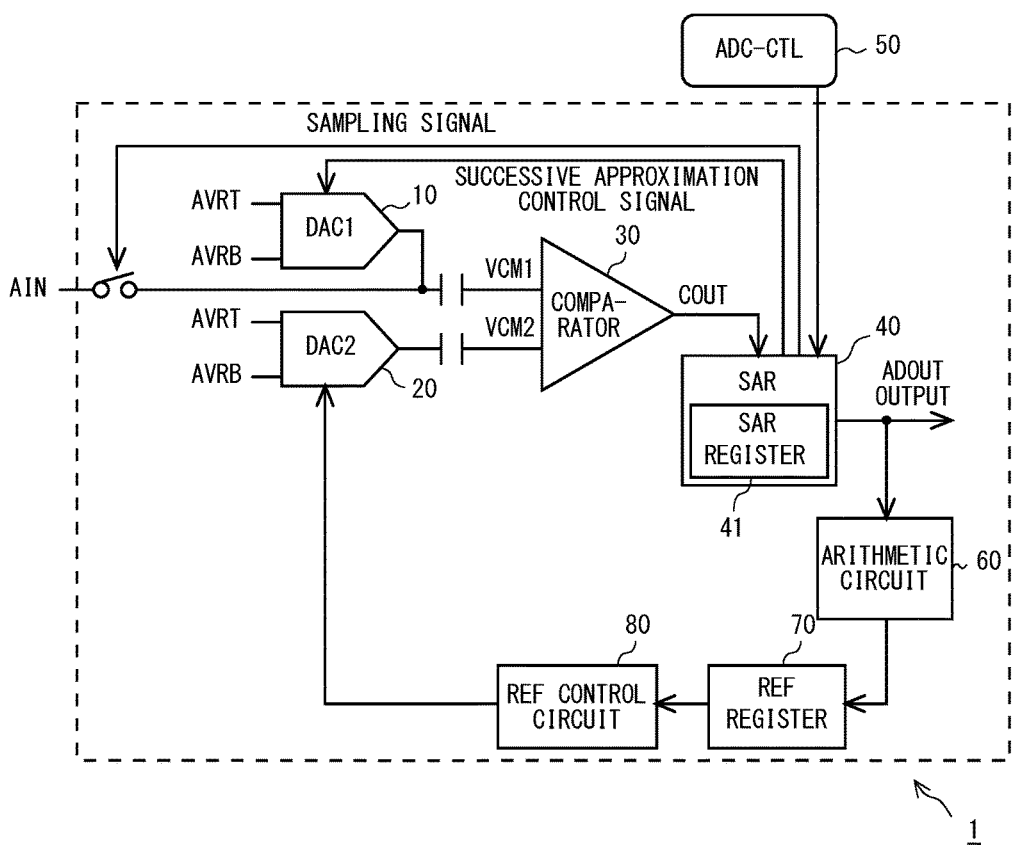
FIG. 1 is a diagram showing a configuration of an AD converter according to a first embodiment.

AD converters according to embodiments of the present invention will be described below with reference to the accompanying drawings. To clarify the explanation, omissions and simplifications are made as necessary in the following description and the drawings. Specific numerical values given in the following embodiments are illustrated by way of example to facilitate understanding of the present invention. Unless otherwise noted, the present invention is not limited to these values. Note that in the drawings, the same elements are denoted by the same reference numerals, and repeated descriptions are omitted as needed.

The embodiments relate to a successive approximation AD converter. The AD converters according to the embodiments include a storage unit that stores an expected value of an AD conversion process. A reference voltage is switched for each AD conversion process based on the expected value of the AD conversion process stored in the storage unit. In this manner, the successive approximation process is performed using the reference voltage that is switched for each AD conversion process, thereby making it possible to suppress noise and improve the AD conversion accuracy.

First Embodiment

Figure 2:
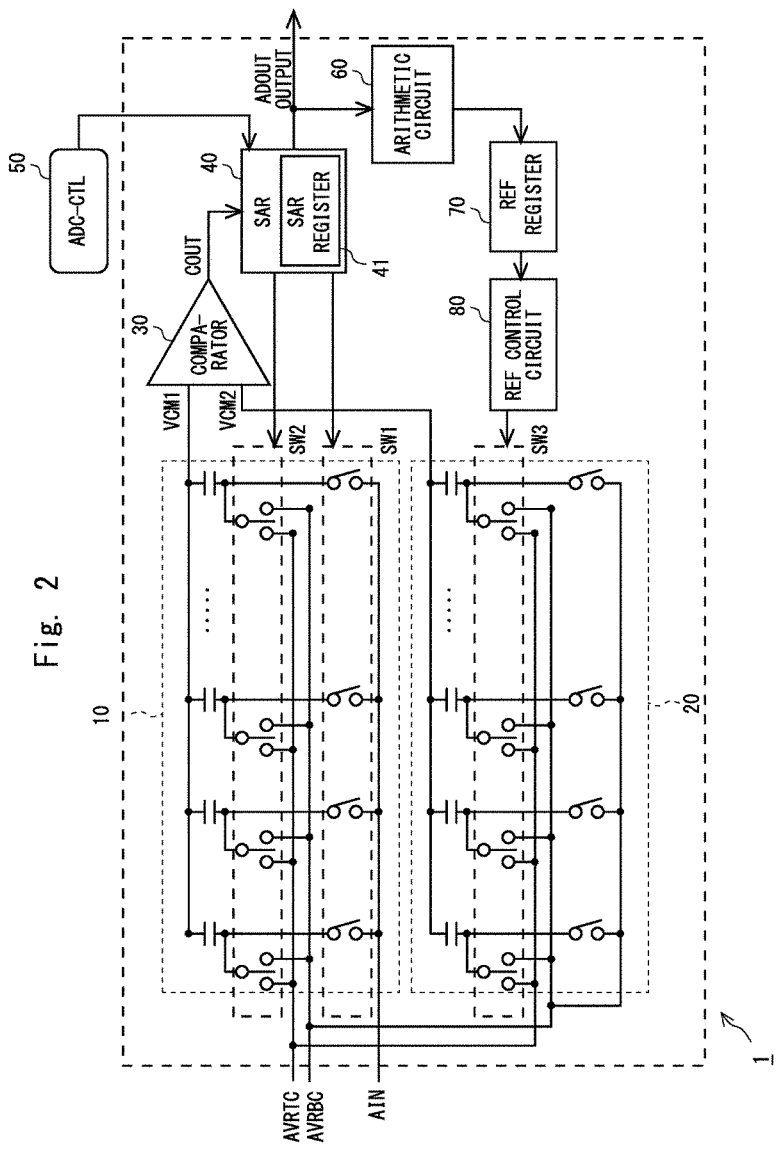
FIG. 2 is a diagram showing details of the configuration of the AD converter shown in FIG. 1.

An AD converter according to a first embodiment will be described with reference to FIGS. 1 and 2. FIG. 1 is a diagram showing a configuration of an AD converter 1 according to the first embodiment. FIG. 2 is a diagram showing details of the configuration of the AD converter 1 shown in FIG. 1. The AD converter 1 performs a sampling process and a successive approximation process on an analog signal, executes an AD conversion process, and outputs an AD conversion result.

An example of the AD converter according to the first embodiment is a charge-redistribution-type successive approximation AD converter of a single-ended input system. In the first embodiment, capacitor array type DACs are used as a DA converter 10 and an REF generation circuit 20. In the first embodiment, the result of the previous AD conversion process is used as the expected value of the AD conversion process. The first embodiment in which the previous AD conversion result is used is based on the premise that a plurality of successive AD conversion processes are carried out.

As shown in FIG. 1, the AD converter 1 includes the DA converter (DAC1) 10, the reference voltage generation circuit (DAC2) (hereinafter referred to as an REF generation circuit) 20, a comparator 30, a successive approximation processing unit (hereinafter referred to as an SAR) 40, an arithmetic circuit 60, an REF register 70, and an REF control circuit 80. An AD control unit (hereinafter referred to as an ADC-CTL) 50 is a control unit that controls the start of the AD conversion process, for example, in a semiconductor device or a microcomputer including the AD converter 1.

The DA converter 10 has different roles in a sampling period and a successive approximation period, respectively, in the AD conversion process. In the sampling period, the DA converter 10 samples a voltage value of an analog input signal AIN. In the successive approximation period, the DA converter 10 generates a comparison voltage VCM1 based on the sampling value of the analog input signal AIN and a successive approximation control signal which is described later.

The REF generation circuit 20 generates a reference voltage VCM2 used for the successive approximation process. The generation of the reference voltage in the REF generation circuit 20 will be described later. The comparator 30 performs successive approximation on the input comparison voltage VCM1 and the reference voltage VCM2, and outputs a successive approximation result COUT to the SAR processing unit 40. The comparator 30 may include a preamplifier (not shown) including two input terminals. For example, the comparison voltage VCM1 is input to one of the input terminals of the preamplifier, and the reference voltage VCM2 is input to the other one of the input terminals of the preamplifier.

The SAR processing unit 40 includes an SAR logic circuit (not shown) and an SAR register 41. The SAR logic circuit controls the sequence operation of the successive approximation process described above. The SAR register 41 stores an AD conversion result ADOUT. The SAR processing unit 40 calculates the AD conversion result ADOUT from a successive approximation result COUT of the comparator 30, and supplies the AD conversion result ADOUT to the SAR register 41. The SAR processing unit 40 generates a sampling signal for controlling a switch SW1, which is described later, in the DA converter 10. Further, the SAR processing unit 40 outputs the successive approximation control signal for controlling a switch SW2, which is described later, in the DA converter 10, by using the value of the SAR register 41 based on the successive approximation result COUT.

When a predetermined number of successive approximation processes are completed, the SAR processing unit 40 outputs the AD conversion result ADOUT, which is a digital signal, based on the successive approximation process result stored in the SAR register 41. Any configuration generally used in the successive approximation AD converter may be used as the configuration of the comparator 30, the SAR processing unit 40, the ADC-CTL 50, and the like.

Next, the configurations of the DA converter 10 and the REF generation circuit 20 will be described in detail with reference to FIG. 2. As shown in FIG. 2, the DA converter 10 is an analog-input-side capacitor array and includes a plurality of first unit capacitors corresponding to the number of bits according to the resolution. One end of each of the first unit capacitors constituting the DA converter 10 is connected to the analog input signal AIN through the switch SW1. The switch SW1 turns on in the sampling period, and turns off in the successive approximation period. Accordingly, in the sampling period, all the first unit capacitors are connected to the analog input signal AIN, which allows the DA converter 10 to be charged.

Further, one end of each of the first unit capacitors constituting the DA converter 10 is connected to a high-side reference voltage AVRTC or a low-side reference voltage AVRBC through the switch SW2. In the successive approximation period, each of the first unit capacitors is selectively connected to one of the high-side reference voltage AVRTC and the low-side reference voltage AVRBC according to the successive approximation control signal output from the SAR processing unit 40. The other end of each of the plurality of first unit capacitors is connected to one of the input terminals of the comparator 30.

As a digital value (code value) output from the SAR processing unit 40 increases, the number of the first unit capacitors connected to the high-side reference voltage AVRTC increases. As the code value decreases, the number of the first unit capacitors connected to the low-side reference voltage AVRBC increase. Accordingly, the comparison voltage VCM1 used for the successive approximation process sequentially changes. The comparator 30 compares the comparison voltage VCM1 with the reference voltage signal, so that digital signals to be output are determined in the order from the MSB (Most Significant Bit).

Next, the REF generation circuit 20 will be described. The REF generation circuit 20 is a reference input-side capacitor array, and includes a plurality of second unit capacitors. The number of the second unit capacitors is the same as the number of the first unit capacitors constituting the DA converter 10. The total capacitance value of the plurality of first unit capacitors constituting the DA converter 10 is equal to the total capacitance value of the plurality of second unit capacitors constituting the REF generation circuit 20.

One end of each of the second unit capacitors of the REF generation circuit 20 is connected to the high-side reference voltage AVRTC or the low-side reference voltage AVRBC through a switch SW3. In the successive approximation period, each of the second unit capacitors is selectively connected to one of the high-side reference voltage AVRTC and the low-side reference voltage AVRBC according to the expected value stored in the REF register 70. The other end of each of the plurality of second unit capacitors is connected to the other one of the input terminals of the comparator 30. Thus, the reference voltage, which is generated based on the expected value of the AD conversion process, is input to the comparator 30.

The AD conversion result ADOUT output from the SAR processing unit 40 is input to the arithmetic circuit 60. The arithmetic circuit 60 performs arithmetic processes, such as an averaging process, on the AD conversion result ADOUT. In the first embodiment, the result of the previous AD conversion process is used as the expected value of the AD conversion process. Accordingly, the AD conversion result may be directly output to the REF register 70, without providing the arithmetic circuit 60.

The REF register 70 is a storage unit that stores the expected value of the AD conversion process. In the first embodiment, the REF register 70 stores the previous AD conversion result (code value) as the expected value. As in the first embodiment, when the previous AD conversion result ADOUT is used as the expected value without performing any arithmetic process or the like on the AD conversion result, the REF register 70 and the SAR register 41 can be used in common.

The REF control circuit 80 is a switch driver that controls the switch SW3 of the REF generation circuit 20 with reference to the expected value stored in the REF register 70. In the first embodiment, since the previous AD conversion result is used, the previous AD conversion result may be directly buffered and output.

Figure 3:
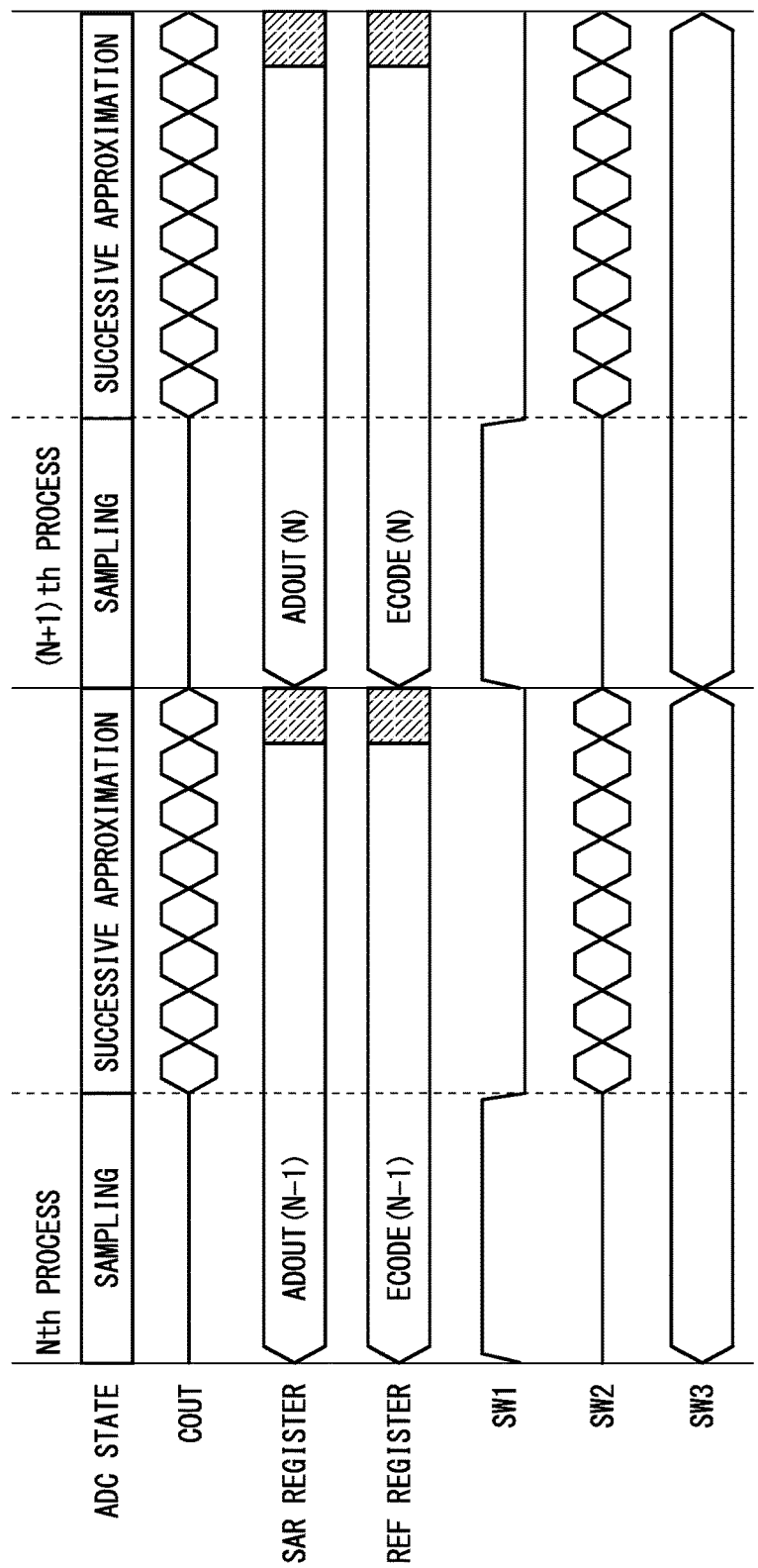
FIG. 3 is a timing diagram for explaining an operation of the AD converter according to the first embodiment.

Referring now to FIG. 3, the operation of the AD converter 1 according to the first embodiment will be described. FIG. 3 is a timing diagram for explaining the operation of the AD converter 1 according to the first embodiment. The AD converter 1 performs the AD conversion process a plurality of times in succession. FIG. 3 shows the Nth and (N+1)th AD conversion processes.

In the Nth AD conversion process, the SAR register 41 stores an AD conversion result ADOUT (N−1) of the (N−1) th AD conversion process, and the REF register 70 stores a code value ECODE (N−1) which is a digital value representing the AD conversion result ADOUT (N−1) of the (N−1)th AD conversion process.

When the Nth AD conversion process is started, the sampling process is first executed. In the sampling period, the switch SW1 turns on and the switch SW2 turns off, and the DA converter 10 starts the sampling operation on the analog input signal AIN.

At the same time, in the REF generation circuit 20, the switch SW3 selects one of the high-side reference voltage AVRTC and the low-side reference voltage AVRBC in accordance with the code value ECODE (N−1) stored in the REF register 70. Accordingly, the REF generation circuit 20 outputs the reference voltage VCM2 according to the code value ECODE (N−1).

When the sampling period ends, the successive approximation process is started. In the successive approximation period, the switch SW1 turns off. The switch SW2 selects one of the high-side reference voltage AVRTC and the low-side reference voltage AVRBC according to the successive approximation control signal from the SAR processing unit 40. At this time, in the REF generation circuit 20, the selected state of the switch SW3 does not change, and the reference voltage VCM2 which is the same as that in the sampling period is output. In other words, in the first AD conversion process, the reference voltage VCM2 in the sampling period is equal to the reference voltage VCM2 in the successive approximation period.

After that, the comparator 30 performs successive approximation of the comparison voltage VCM1 and the reference voltage VCM2, and outputs the successive approximation result COUT to the SAR processing unit 40. When a predetermined number of successive approximation processes are completed, the SAR register 41 is updated, and an Nth AD conversion result ADOUT (N) is obtained. Further, a code value ECODE (N) is set in the REF register 70 as a new expected value.

Similarly, in the (N+1)th AD conversion process, the switch SW3 selects one of the high-side reference voltage AVRTC and the low-side reference voltage AVRBC in accordance with the code value ECODE (N) stored in the REF register 70. Accordingly, the REF generation circuit 20 outputs the reference voltage VCM2 according to the code value ECODE (N). The above-described sequence is repeated and the AD conversion process is executed a plurality of times in succession, thereby obtaining the AD conversion result ADOUT. Thus, the expected value stored in the REF register 70 is updated every time the AD conversion process is performed. Accordingly, the REF generation circuit 20 updates the reference voltage every time the AD conversion process is performed.

The propagation of noise during the successive approximation process of the AD converter 1 shown in FIGS. 1 and 2 will now be described. For clarity of the explanation, only the noise generated in the high-side reference voltage AVRTC and the low-side reference voltage AVRBC is considered. To facilitate understanding, the propagation of noise in the AD converter disclosed in Japanese Unexamined Patent Application Publication No. 2014-11768 will be first described, and the propagation of noise in the AD converter 1 according to the first embodiment will be described thereafter.

Figure 10A:
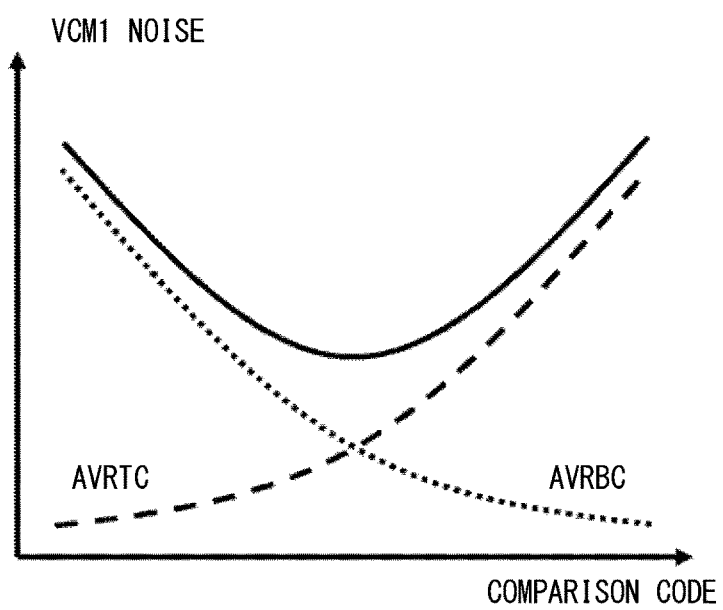
FIG. 10A is a graph for explaining the mechanism of noise propagation according to a comparative example.
Figure 10B:
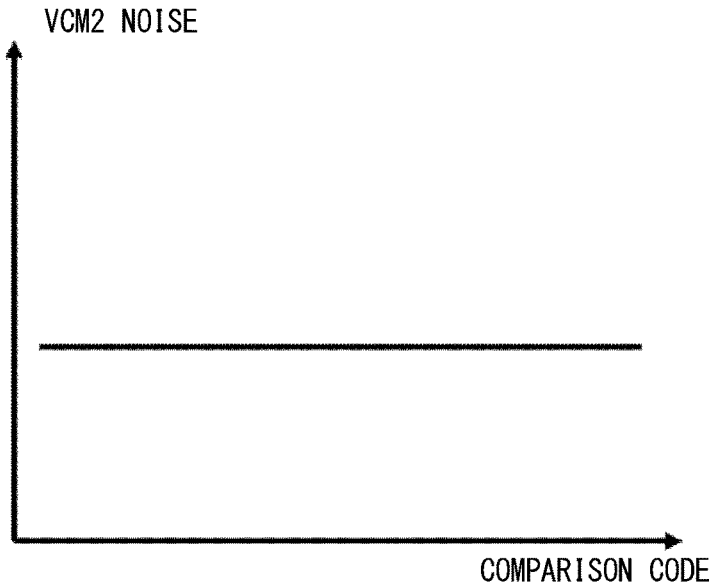
FIG. 10B is a graph for explaining the mechanism of noise propagation according to the comparative example.
Figure 10C:
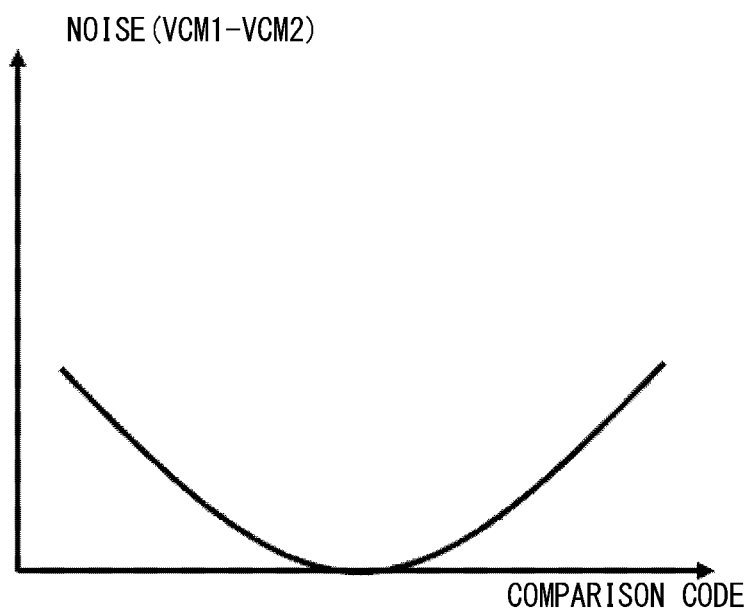
FIG. 10C is a graph for explaining the mechanism of noise propagation according to the comparative example.

FIGS. 10A to 10C are graphs for explaining the mechanism of noise propagation according to a comparative example disclosed in Japanese Unexamined Patent Application Publication No. 2014-11768. FIG. 10A shows an example of noise in the comparison voltage VCM1. In FIG. 10A, the horizontal axis represents a comparison code in a successive approximation process, and the vertical axis represents the amount of noise in the comparison voltage VCM1.

In FIG. 10A, a long dashed line represents the amount of noise generated in the high-side reference voltage AVRTC; a short dashed line represents the amount of noise generated in the low-side reference voltage AVRBC; and a solid line represents the sum of the amount of noise generated in the high-side reference voltage AVRTC and the amount of noise generated in the low-side reference voltage AVRBC.

In the successive approximation period, each of the first unit capacitors constituting the DA converter 10 is connected to one of the high-side reference voltage AVRTC and the low-side reference voltage AVRBC. Therefore, the noise appearing in the comparison voltage VCM1 includes noise propagating from the high-side reference voltage AVRTC and noise propagating from the low-side reference voltage AVRBC.

As shown in FIG. 10A, as the value of the comparison code increases, the number of switches SW2 connected to the high-side reference voltage AVRTC increases. Accordingly, the amount of noise generated due to the high-side reference voltage AVRTC increases. As the value of the comparison code decreases, the number of switches SW2 connected to the low-side reference voltage AVRBC increases. Accordingly, the amount of noise generated due to the low-side reference voltage AVRBC increases.

In general, the noise included in the high-side reference voltage AVRTC is different from the noise included in the low-side reference voltage AVRBC. Thus, as shown in FIG. 10A, the amount of noise appearing in the comparison voltage VCM1 is minimized when the comparison code indicates an intermediate value, and the amount of noise increases as the value of the comparison code decreases or increases.

FIG. 10B shows an example of noise in the reference voltage VCM2. In FIG. 10B, the horizontal axis represents the comparison code and the vertical axis represents the amount of noise in the reference voltage VCM2. In the example disclosed in Japanese Unexamined Patent Application Publication No. 2014-11768, the ratio between the capacitance value of the first capacitor element, which is connected to the high-side reference voltage of the reference voltage generation circuit, and the capacitance value of the second capacitor element, which is connected to the low-side reference voltage of the reference generation circuit, is set to 5:5. The reference voltage generation circuit disclosed in Japanese Unexamined Patent Application Publication No. 2014-11768 has noise sensitivity characteristics related to both the high-side reference voltage and the low-side reference voltage.

Specifically, the noise appearing in the reference voltage VCM2 includes noise propagating from the high-side reference voltage AVRTC through the first capacitor element and noise propagating from the low-side reference voltage AVRBC through the second capacitor element. The amount of noise appearing in the reference voltage VCM2 includes $5/10$ of the noise propagating from the high-side reference voltage AVRTC and $5/10$ of the noise propagating from the low-side reference voltage AVRBC. However, in the successive approximation period, the connection state of the switch in the reference voltage generation circuit does not change. Accordingly, the amount of noise appearing in the reference voltage VCM2 is constant regardless of the value of the comparison code.

FIG. 10C shows a difference between noise in the comparison voltage VCM1 shown in FIG. 10A and noise in the reference voltage VCM2 shown in FIG. 10B. In FIG. 10C, the horizontal axis represents the comparison code and the vertical axis shows the difference between noise in the comparison voltage VCM1 and noise in the reference voltage VCM2.

One half of the noise appearing in the reference voltage VCM2 is noise propagating from the high-side reference voltage AVRTC, and the other half of the noise is noise propagating from the low-side reference voltage AVRBC. Accordingly, when the code value indicates an intermediate value, the noise in the comparison voltage VCM1 and the noise in the reference voltage VCM2 are cancelled, and the difference between the noise in the comparison voltage VCM1 and the noise in the reference voltage VCM2 is minimized.

On the other hand, as the value of the comparison code moves away from the intermediate value, the noise difference between the comparison voltage VCM1 and the reference voltage VCM2 increases. When the comparison code represents a full-scale level (zero-scale level), the noise propagating from the high-side reference voltage AVRTC (low-side reference voltage AVRBC) remains as it is. In other words, since the reference voltage is set to an intermediate value in Japanese Unexamined Patent Application Publication No. 2014-11768, the difference in noise appears as the value of the comparison code moves away from the intermediate value. That is, in Japanese Unexamined Patent Application Publication No. 2014-11768, the reference noise can be reduced by half in the entire analog input range. However, since the amount that noise is to be reduced is determined according to the ratio between the capacitance value of the first capacitor element and the capacitance value of the second capacitor element, the effect of noise cannot be reduced by less than half.

The noise difference between the comparison voltage VCM1 and the reference voltage VCM2 leads to an erroneous detection of the comparator. In particular, as the value of the comparison code becomes closer to the analog input signal AIN, the voltage difference between the comparison voltage VCM1 and the reference voltage VCM2 decreases. As a result, the comparator tends to make an erroneous determination due to the effect of noise. In the case of Japanese Unexamined Patent Application Publication No. 2014-11768, when the analog input signal AIN is set in the vicinity of the intermediate value, the AD conversion accuracy is improved, while the AD conversion accuracy deteriorates as the analog input signal AIN moves away from the intermediate value.

The propagation of noise during the successive approximation process in the AD converter 1 according to the first embodiment will be described with reference to FIGS. 4A to 4C and FIGS. 5A to 5C. As described above, in the first embodiment, the previous AD conversion result ADOUT is directly used as the expected value, without performing any operation on the AD conversion result. In other words, the reference voltage becomes a voltage corresponding to the previous AD conversion result ADOUT.

Figure 4A:
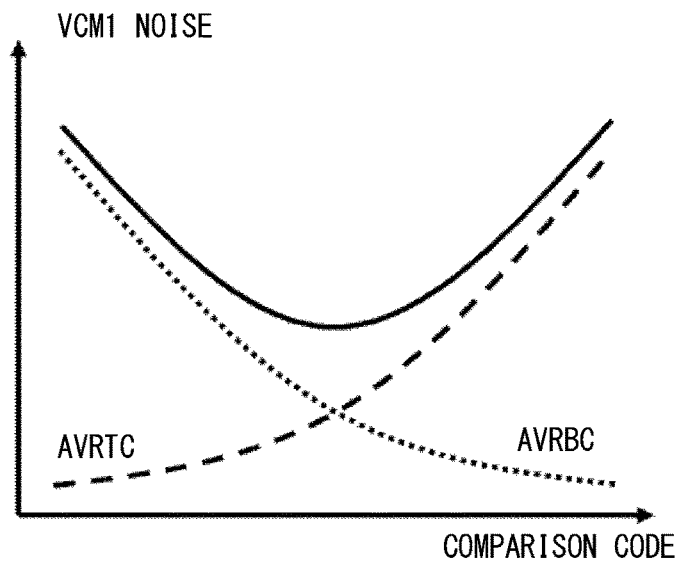
FIG. 4A is a graph for explaining the mechanism of noise propagation of the AD converter according to the first embodiment.
Figure 4B:
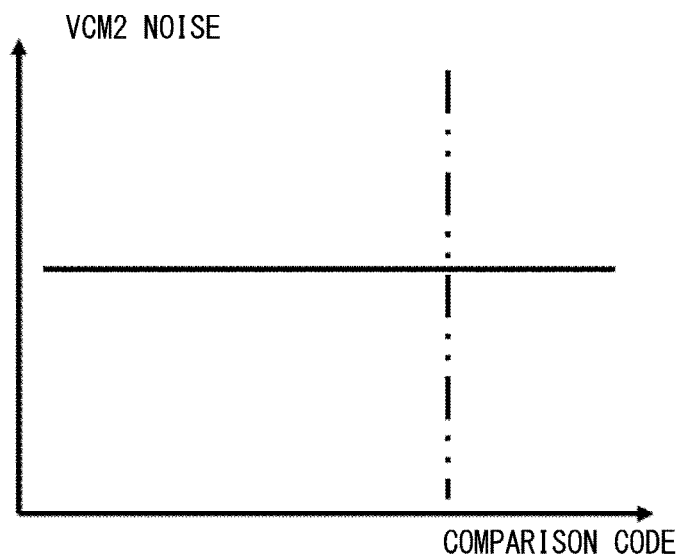
FIG. 4B is a graph for explaining the mechanism of noise propagation in the AD converter according to the first embodiment.
Figure 4C:
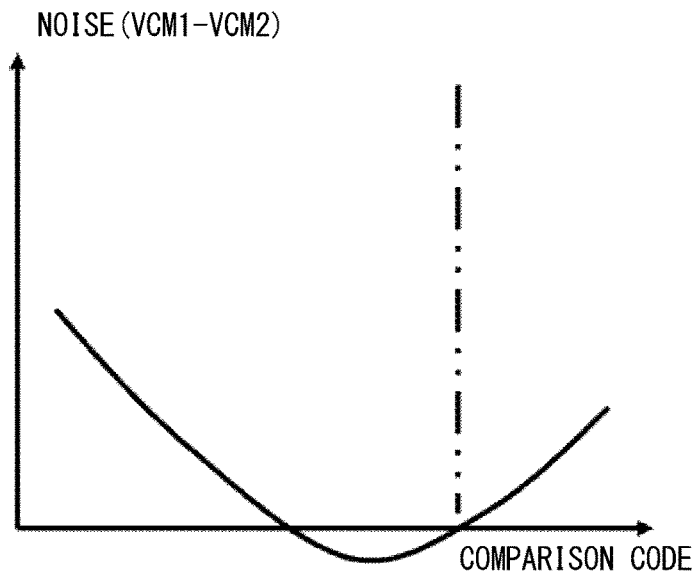
FIG. 4C is a graph for explaining the mechanism of noise propagation in the AD converter according to the first embodiment.

FIGS. 4A to 4C show examples of noise when a code value higher than the intermediate value is set as the expected value in the REF register 70. FIG. 4A shows an example of noise in the comparison voltage VCM1 according to the first embodiment. FIG. 4A is similar to FIG. 10A.

FIG. 4B shows an example of noise in the reference voltage VCM2 according to the first embodiment. In FIG. 4B, the horizontal axis represents the comparison code and the vertical axis represents the amount of noise in the reference voltage VCM2. In FIG. 4B, the code value set as the expected value is represented by an alternate long and two short dashes line. In the REF generation circuit 20, the connection destination of the switch SW3 is controlled according to the expected value stored in the REF register 70. Accordingly, the reference voltage VCM2 changes according to the expected value set in the REF register 70.

The REF generation circuit 20 has noise sensitivity characteristics related to both the high-side reference voltage and the low-side reference voltage. The amount of noise appearing in the reference voltage VCM2 includes noise propagating from the high-side reference voltage AVRTC and noise propagating from the low-side reference voltage AVRBC at a ratio depending on the connection destination of the switch SW3. In the successive approximation period, the connection state of the switch in the reference voltage generation circuit does not change, so that the amount of noise appearing in the reference voltage VCM2 is constant regardless of the value of the comparison code.

FIG. 4C shows a difference between noise in the comparison voltage VCM1 shown in FIG. 4A and noise in the reference voltage VCM2 shown in FIG. 4B. In FIG. 4C, the horizontal axis represents the comparison code and the vertical axis represents the difference between noise in the comparison voltage VCM1 and noise in the reference voltage VCM2.

In the first embodiment, in the expected value stored in the REF register 70, that is, in the comparison code representing the previous AD conversion result ADOUT, the noise in the comparison voltage VCM1 and the noise in the reference voltage VCM2 are cancelled. As a result, the difference between the noise in the comparison voltage VCM1 and the noise in the reference voltage VCM2 is minimized.

Figure 5A:
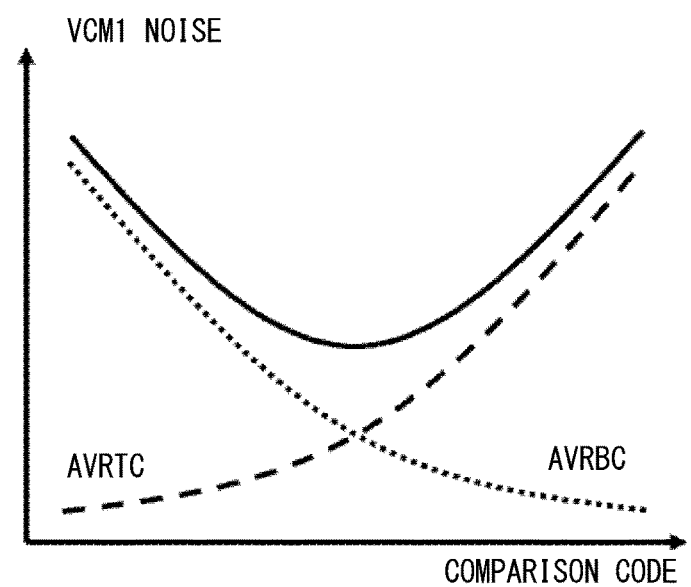
FIG. 5A is a graph for explaining the mechanism of noise propagation in the AD converter according to the first embodiment.
Figure 5B:
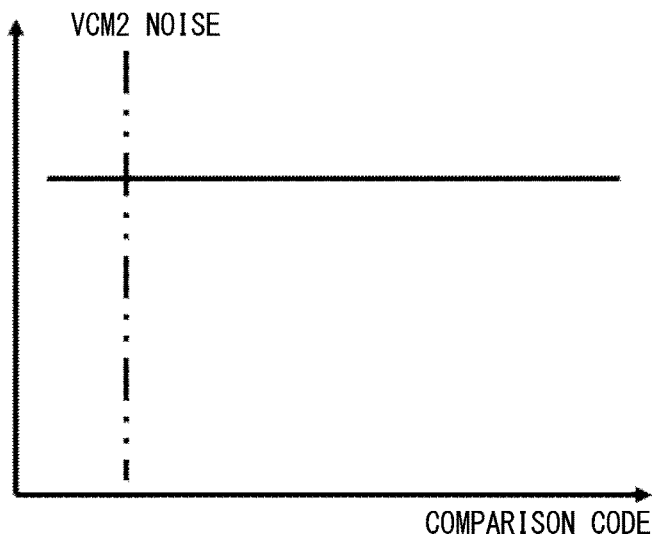
FIG. 5B is a graph for explaining the mechanism of noise propagation in the AD converter according to the first embodiment.
Figure 5C:
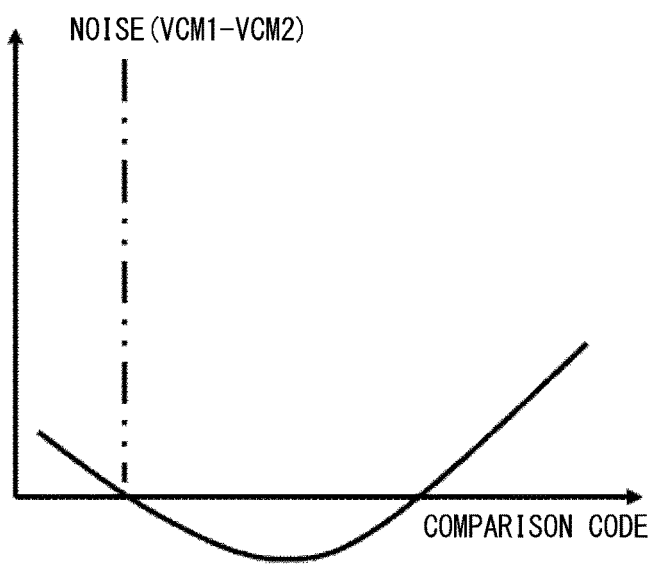
FIG. 5C is a graph for explaining the mechanism of noise propagation in the AD converter according to the first embodiment.

FIGS. 5A to 5C show examples of noise when a code value close to the low level is set as the expected value in the REF register 70. In other words, in the examples shown in FIGS. 5A to 5C, the previous AD conversion result ADOUT is close to the low level. FIG. 5A shows an example of noise in the comparison voltage VCM1 according to the first embodiment. FIG. 5A is similar to FIG. 10A.

FIG. 5B shows an example of noise in the reference voltage VCM2 according to the first embodiment. In FIG. 5B, the horizontal axis represents the comparison code and the vertical axis represents the amount of noise in the reference voltage VCM2. In FIG. 5B, the code value set as the expected value is represented by an alternate long and two short dashes line. Since the expected value set in the REF register 70 is a code value close to the low level, the number of switches SW3 connected to the low-side reference voltage AVRBC in the REF generation circuit 20 increases. Accordingly, the amount of noise shown in FIG. 5B is greater than the amount of noise shown in FIG. 4B.

FIG. 5C shows the difference between noise in the comparison voltage VCM1 shown in FIG. 5A and noise in the reference voltage VCM2 shown in FIG. 5B. As shown in FIG. 5C, the comparison code in which the difference between noise in the comparison voltage VCM1 and noise in the reference voltage VCM2 is minimized is shifted to the low side in comparison with the noise difference shown in FIG. 4C.

As described above, it is obvious that as the value of the comparison code becomes closer to the analog input voltage AIN, the voltage difference between the comparison voltage VCM1 and the reference voltage VCM2 decreases. As a result, the comparator tends to make an erroneous determination due to the effect of noise. Therefore, there is a demand for reducing the effect of noise when the value of the comparison code becomes closer to the analog input voltage AIN.

In the first embodiment, the noise in the comparison code representing the previous AD conversion result is minimized. Accordingly, as the difference between a previous analog input voltage AIN (N) and a current analog input voltage AIN (N+1) decreases, the comparator is less likely to make an erroneous determination. This leads to an improvement in AD conversion accuracy. Since the resistance to noise is improved, the AD converter 1 with an improved accuracy can be provided at a lower voltage. Furthermore, the AD conversion accuracy can be improved even when power supply input and reference input pins are shared.

Thus, the first embodiment is carried out under the conditions that the AD conversion processes are executed in succession and a variation in the analog input voltage (i.e., the difference between AIN (N) and AIN (N+1)) is small. The AD converter 1 according to the first embodiment is desirably applied to an application in which AD conversion is performed a plurality of times on a DC signal and an averaging process is performed on the AD conversion result. For example, the AD converter 1 according to the first embodiment is suitable for onboard products or sensors which are required to have high reliability and high accuracy.

The analog input signal AIN treated by the AD converter 1 is not limited to the DC signal, but it may be a relatively slow speed AC signal. Referring to FIGS. 4C and 5C, when the previous AD conversion result ADOUT is used as the expected value, like in the first embodiment, the amount of noise increases as the difference between the previous signal level and the current signal level increases, so that an improvement in AD conversion accuracy cannot be expected. For this reason, it is desirable that the difference between the previous signal level and the current signal level be equal to or less than the full-scale level.

Accordingly, the first embodiment can be applied to AC signals having a frequency equal to one half of the Nyquist frequency (i.e., ¼ of the sampling frequency) at which the difference between the previous analog input signal AIN (N) and the current analog input signal AIN (N+1) is equal to or less than the full-scale level.

Although not shown, the REF control circuit 80 may have a function for switching validation and invalidation of the function for changing the reference voltage in each AD conversion process. As described above, in the first embodiment, when AC signals are treated, the effect of reducing noise to ¼ of the sampling frequency can be obtained. However, when analog input signals with a limit equal to or higher than the above-mentioned limit are treated, the effect of reducing noise cannot be obtained. Accordingly, in the case of treating analog input signals with a limit equal to or higher than the above-mentioned limit, the function for changing the reference voltage in each AD conversion process can be invalidated. In other words, the reference voltage generation circuit can interrupt generation of the reference voltage based on the expected value stored in the REF register 70 according to the analog input signal AIN.

In the case of invalidating the function for changing the reference voltage in each AD conversion process, the value set in the REF register 70 can be fixed as the initial value. The initial value can be set to, for example, ½ of the full-scale level. Thus, the present invention can be applied to signals including DC signals and AC signals having a Nyquist frequency, and the AD conversion accuracy similar to that in Japanese Unexamined Patent Application Publication No. 2014-11768 can be obtained.

In the above embodiment, the previous AD conversion result ADOUT is used as the expected value set in the REF register 70, but the expected value is not limited to this. For example, the expected value may be an m (an integer greater than 1)th AD conversion result ADOUT.

The expected value set in the REF register 70 may be a value obtained by an operation in the arithmetic circuit 60 using the AD conversion result ADOUT. For example, a value obtained by averaging a plurality of AD conversion results ADOUT can be used as the expected value. The average value of the plurality of AD conversion results ADOUT is a value close to a pure signal component in which the high-frequency component of noise to be superimposed on the analog input signal AIN is attenuated, and thus the average value is suitable for the expected value.

Figure 6:
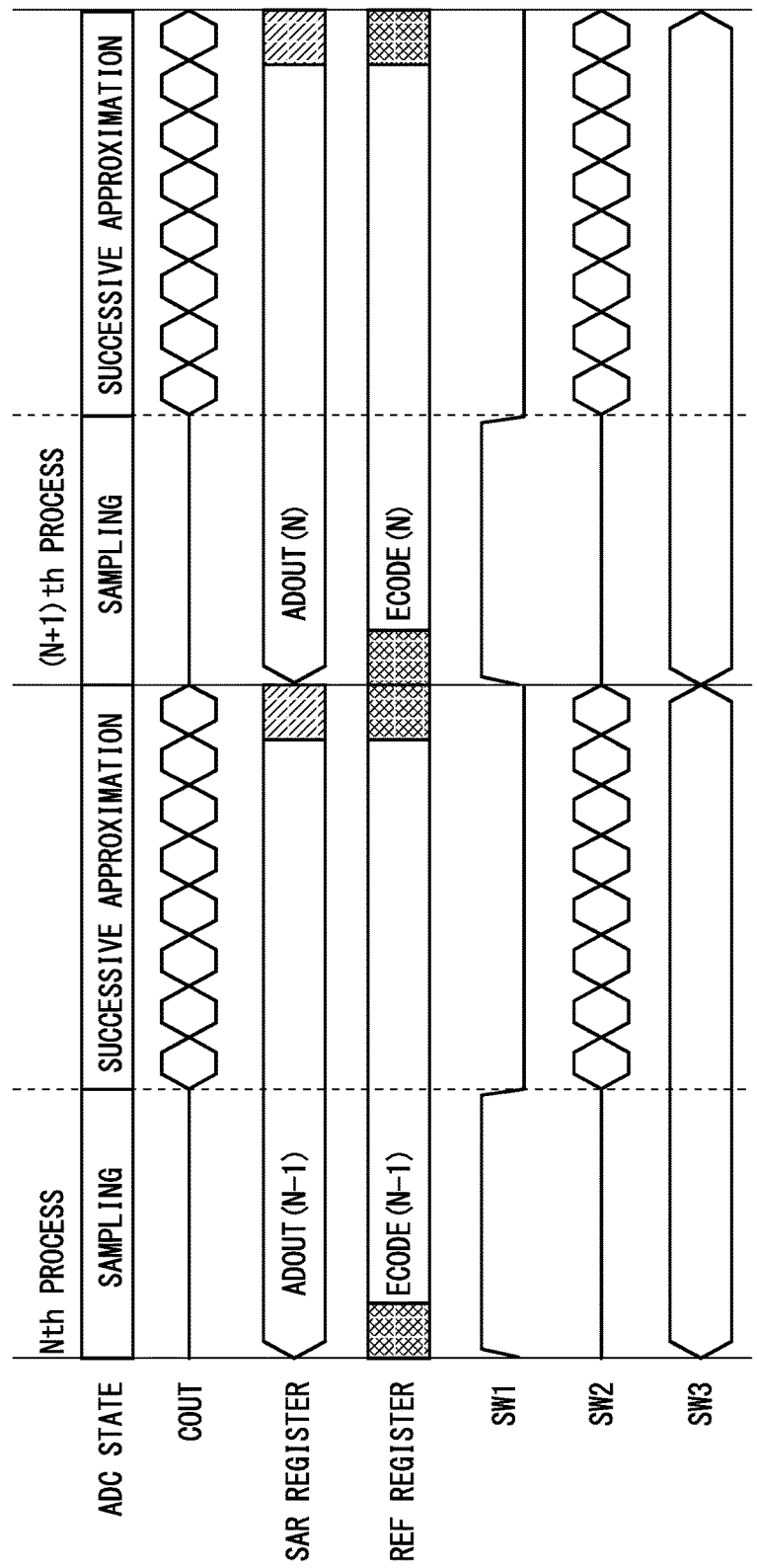
FIG. 6 is a timing diagram for explaining another operation of the AD converter according to the first embodiment.

FIG. 6 shows an operation timing diagram when the average value of the plurality of AD conversion results ADOUT is set in the REF register 70 as the expected value. As shown in FIG. 6, in the Nth AD conversion process, the SAR register 41 is updated with the AD conversion result ADOUT (N−1), and then the expected value set in the REF register 70 is updated. A value obtained by performing an arithmetic process in the arithmetic circuit 60 using the AD conversion result ADOUT (N−1) and a plurality of previous AD conversion results ADOUT is used as the expected value set in the REF register 70. If the operation requires a lot of time, updating of the REF register 70 may be delayed.

Second Embodiment

Figure 7:
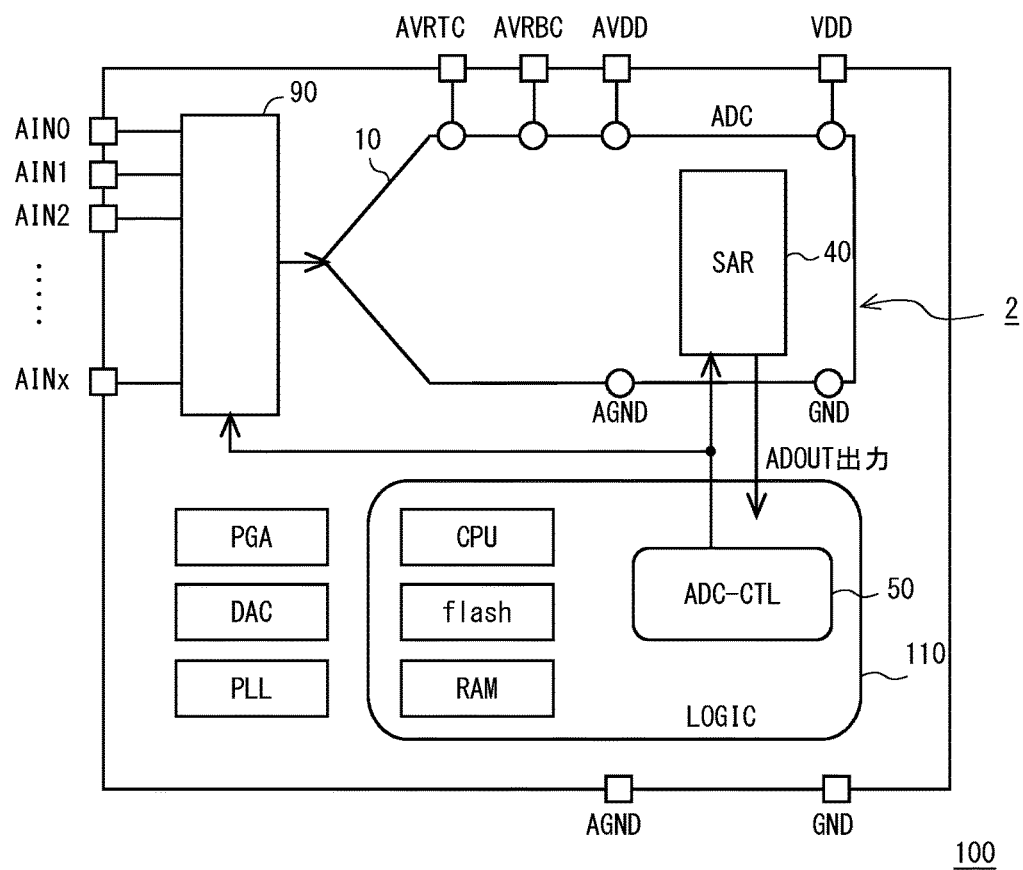
FIG. 7 is a diagram showing a configuration of a semiconductor device incorporating an AD converter according to a second embodiment.
Figure 8:
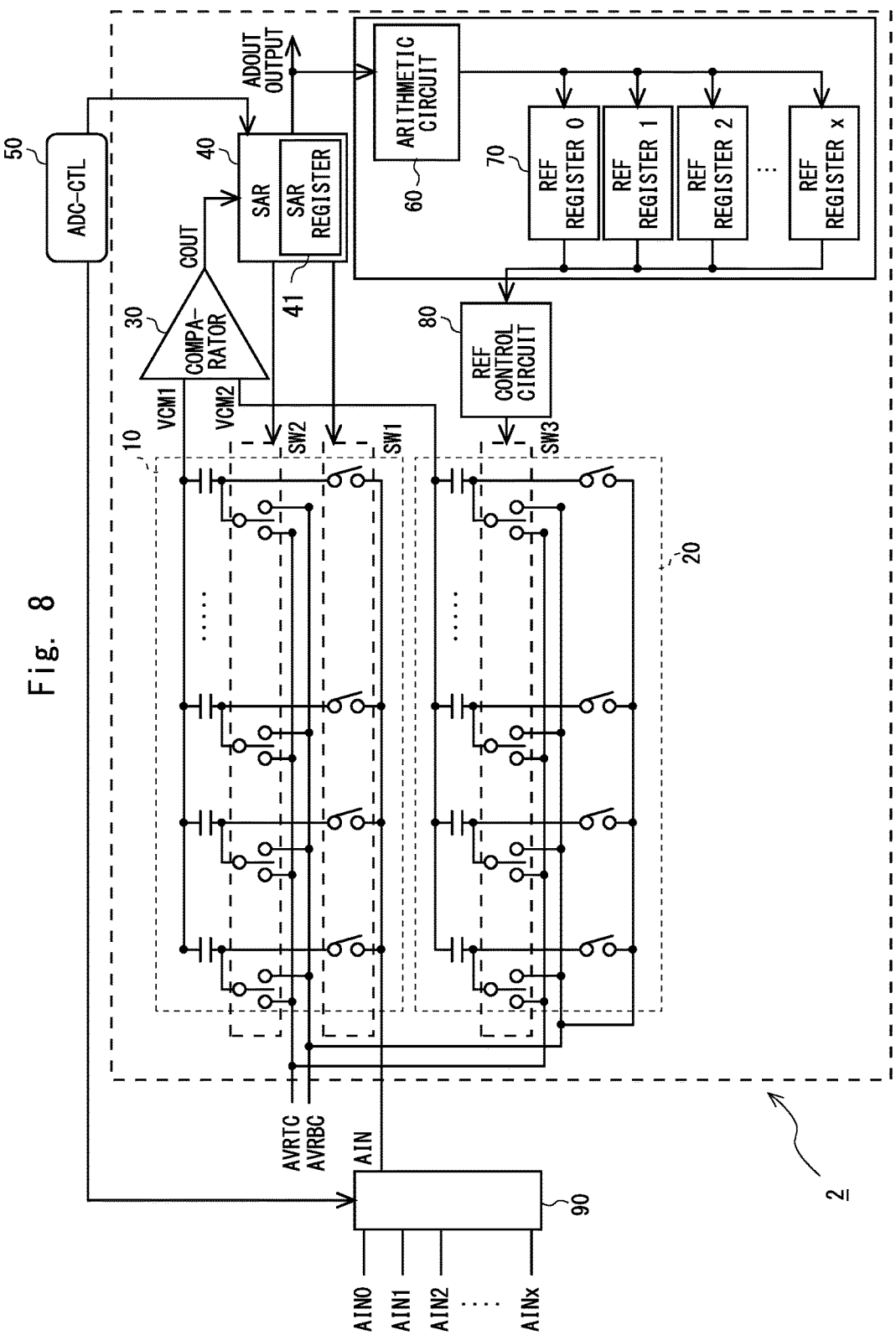
FIG. 8 is a diagram showing details of the configuration of the AD converter shown in FIG. 7.

An AD converter according to a second embodiment will be described with reference to FIGS. 7 and 8. FIG. 7 is a diagram showing a configuration example of a semiconductor device 100 having an AD converter 2 mounted thereon according to the second embodiment. FIG. 8 is a diagram showing details of the configuration of the AD converter 2 shown in FIG. 7. The second embodiment differs from the first embodiment in that the AD converter 2 includes a plurality of REF registers 70 respectively corresponding to a plurality of channels.

As shown in FIG. 7, the semiconductor device 100 having the AD converter 2 mounted thereon includes a multiplexer 90 and a logic core unit 110. The semiconductor device is used for, for example, a sensor. The multiplexer 90 includes a plurality of analog input terminals AIN0 to AINx. The multiplexer 90 supplies one analog input signal, which is selected from the analog input signals received from the analog input terminals AIN0 to AINx, to the AD converter 2 as the analog input signal AIN. The AD converter 2 performs a sampling process and a successive approximation process on the analog input signal AIN, executes an AD conversion process, and outputs an AD conversion result.

The logic core unit 110 includes the ADC-CTL 50, a CPU (Central Processing Unit), a RAM (Random Access Memory), and a flash memory (flash non-volatile memory). The ADC-CTL 50 performs control for starting the AD conversion process in the AD converter 2, selection of the multiplexer 90, and the like. The semiconductor device 100 may include a DAC, a PLL (Phase Locked Loop), a PGA (Programmable Gain Amplifier), and the like, as needed.

Although not shown, a digital signal output from the AD converter 2 is supplied to the CPU via a bus. The CPU performs, for example, control of peripheral devices (not shown) and other arithmetic processes using the supplied digital signals. The arithmetic process results and the like obtained by the CPU are stored in a RAM (Random Access Memory) or a flash memory.

The configuration of the AD converter 2 will now be described with reference to FIG. 8. As shown in FIG. 8, the AD converter 2 has a configuration substantially similar to that of the AD converter 1 illustrated in the first embodiment. In the AD converter 2, a plurality of REF registers 70 are provided. The plurality of REF registers 70 are provided so as to correspond to the analog input terminals AIN0 to AINx, respectively, of the multiplexer 90. For example, an REF register 0 corresponds to the analog input terminal AIN0, and an REF register 1 corresponds to the analog input terminal AIN1. In this manner, the REF registers 70 are provided in a one-to-one correspondence with the analog input terminals of the multiplexer 90.

When the AD conversion process is performed on one of the plurality of channels, the REF generation circuit 20 generates the reference voltage with reference to the REF register 70 corresponding to the channel. For example, when the AD conversion is performed on the analog signal input from the analog input terminal AIN0, the REF generation circuit 20 is controlled with reference to the expected value stored in the REF register 0, to thereby generate the reference voltage.

Like in the first embodiment, the previous AD conversion result for the analog signal input from the analog input terminal AIN0 can be used as the expected value stored in the REF register 70. In other words, the AD conversion results are stored in the REF registers 0 to x, respectively, for each channel. With this configuration, noise in each channel can be reduced and the AD conversion accuracy can be improved.

The number of REF registers 70 may be equal to or less than the number of channels. For example, the REF registers 70 are provided for the channels that are required to have high accuracy in the AD conversion process, and the REF registers need not be provided for the channels that are required to have relatively low accuracy in the AD conversion process. Accordingly, an increase in unnecessary area can be suppressed.

Also in the AD converter 2, if the AD conversion result ADOUT is directly set in each REF register 70 as the expected value without performing any arithmetic process on the AD conversion result, there is no need to provide the arithmetic circuit 60.

Third Embodiment

Figure 9:
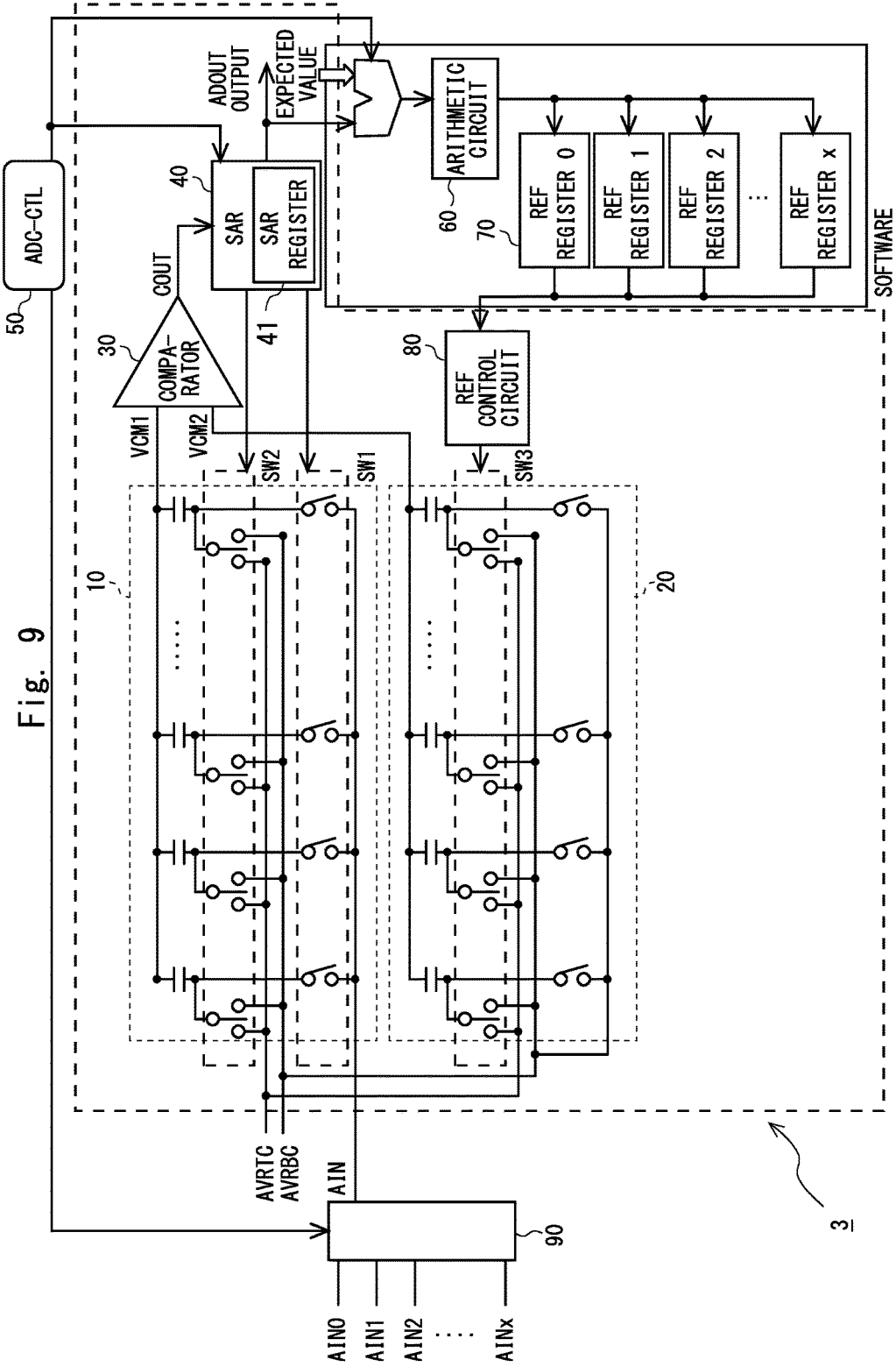
FIG. 9 is a diagram showing a configuration of an AD converter according to a third embodiment.

An AD converter according to a third embodiment will be described with reference to FIG. 9. FIG. 9 is a diagram showing a configuration of an AD converter 3 according to the third embodiment. The third embodiment differs from the second embodiment in that expected values of AD conversion results can be input to the respective REF registers 70, which correspond to the plurality of channels, respectively, from the outside.

As shown in FIG. 9, in the AD converter 3, the function of the arithmetic circuit 60 and the function of each REF register 70 to store the expected value of the AD conversion result for each channel are provided in software. To facilitate understanding, FIG. 9 illustrates the arithmetic circuit 60 and the REF registers 70. The expected values of the AD conversion results respectively corresponding to the analog signals input from the analog input terminals AIN0 to AINx of the multiplexer 90 are set in the respective REF registers 70 from the outside.

For example, in a monitoring device for detecting a disconnection, a sensor system, and the like, an expected value of an AD conversion result may exist, or an algorithm for estimating the expected value may exist. In such a case, in the AD converter 3, the estimated expected value is input to each REF register 70 via software. With this configuration, the AD conversion accuracy in the vicinity of the externally input expected value can be improved.

If the operation for predicting the expected value is complicated, the reference voltage is generated using the expected value obtained by preliminarily performing an arithmetic process using software. This leads to an improvement in the AD conversion accuracy in the vicinity of the expected value. For example, a band-pass filter can be implemented by software processing, and the conversion accuracy of analog input signals in a specific frequency band can be improved. Further, in the third embodiment, the use of the register and arithmetic functions of the software generally makes it possible to reduce the number of REF registers and arithmetic circuits in the hardware of the AD converter. This allows miniaturization of the AD converter.

If there are a plurality of AD conversion results for a plurality of AD converters 3, the AD conversion result of another AD converter, or a value predicted from the AD conversion result of another AD converter, may be used as the expected value of a certain AD converter.

The successive approximation AD converters according to the first and third embodiments can also be applied to semiconductor devices used for, for example, a sensor system as shown in FIG. 7.

The above embodiments illustrate an example in which the DA converter 10 and the REF generation circuit 20 are capacitor DACs. However, the DA converter 10 and the REF generation circuit 20 may have any configuration, such as a resistor DAC, or a combination of a capacitor DAC and a resistor DAC. While the above embodiments illustrate an example of the single-ended input system, a differential input system may also be used.

The invention made by the present inventor has been described in detail above with reference to embodiments. However, the present invention is not limited to the above embodiments, and can be modified in various ways without departing from the scope of the invention.

The embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An AD (Analog/Digital) converter of a successive approximation type configured to perform a sampling process and a successive approximation process on an analog signal, execute an AD conversion process, and output an AD conversion result, the AD converter comprising:
   a DA (Digital/Analog) converter configured to generate a comparison voltage based on a successive approximation control signal and a sampling value obtained by sampling the analog signal;
   a reference voltage generation circuit configured to generate a reference voltage used for the successive approximation process;
   a comparator configured to compare the comparison voltage with the reference voltage and output a successive approximation result;
   a successive approximation processing unit configured to generate the successive approximation control signal based on the successive approximation result, and to output the AD conversion result; and
   at least one storage unit configured to store an expected value of the AD conversion process based on the AD conversion result,
   wherein the reference voltage generation circuit generates the reference voltage based on the expected value stored in the storage unit,
   wherein the AD converter performs the AD conversion process a plurality of N times in succession, where N is an integer greater than or equal to 3,
   wherein the storage unit stores, as the expected value, the AD conversion result of the AD conversion process preceding an $(N-1)^{th}$ AD conversion process as the expected value, and
   wherein when an $N^{th}$ AD conversion process is performed, the reference voltage generation circuit uses, as the reference voltage, the AD conversion result of the AD conversion process preceding the $(N-1)^{th}$ AD conversion.

2. The AD converter according to claim 1, wherein
   the storage unit stores a plurality of AD conversion results of the AD conversion processes preceding an $(N-1)^{th}$ AD conversion process, and
   when an $N^{th}$ AD conversion process is performed, the reference voltage generation circuit uses, as the reference voltage, an arithmetic processing result based on the plurality of AD conversion results of the AD conversion processes preceding the $(N-1)^{th}$ AD conversion.

3. The AD converter according to claim 1, wherein the expected value stored in the storage unit is updated every time the AD conversion result is output.

4. The AD converter according to claim 1, wherein the reference voltage generation circuit updates the reference voltage every time the AD conversion result is output.

5. The AD converter according to claim 1, wherein
the AD converter comprises a plurality of storage units respectively corresponding to a plurality of channels, and
when the AD conversion process is performed on one of the plurality of channels, the reference voltage generation circuit generates the reference voltage with reference to one of the plurality of storage units corresponding to the one of the plurality of channels.

6. The AD converter according to claim 5, wherein
each of the plurality of the storage units stores a corresponding AD conversion result output for each channel, and
when a subsequent AD conversion process is performed, the reference voltage generation circuit uses, as the reference voltage, the AD conversion process result stored in the storage unit.

7. The AD converter according to claim 1, wherein the analog signal is a DC signal, or an AC signal having a frequency equal to or lower than ¼ of a sampling frequency.

8. The AD converter according to claim 1, wherein the reference voltage generation circuit disables the generation of the reference voltage based on the expected value stored in the storage unit according to a control signal.

9. The AD converter according to claim 1, wherein
the DA converter comprises a plurality of first unit capacitors,
the comparison voltage is generated by respectively connecting one end of each of the plurality of first unit capacitors constituting the DA converter to a high-side reference voltage or a low-side reference voltage based on the successive approximation control signal,
the reference voltage generation circuit comprises a plurality of second unit capacitors, a number of the second unit capacitors equal to a number of the first unit capacitors constituting the DA converter,
the reference voltage is generated by respectively connecting one end of each of the plurality of second unit capacitors constituting the reference voltage generation circuit to a high-side reference voltage or a low-side reference voltage based on the expected value, and
a total capacitance value of the plurality of first unit capacitors constituting the DA converter is equal to a total capacitance value of the plurality of second unit capacitors constituting the reference voltage generation circuit.

10. An AD conversion method of a successive approximation type that performs a sampling process and a successive approximation process on an analog signal, executes an AD conversion process, and outputs an AD conversion result, the AD conversion method comprising:
generating a comparison voltage based on a successive approximation control signal and a sampling value obtained by sampling the analog signal;
generating a reference voltage used for the successive approximation process based on an expected value of the AD conversion process;
comparing the comparison voltage with the reference voltage, and outputting a successive approximation result;
generating the successive approximation control signal based on the successive approximation result; and
generating the AD conversion result based on the successive approximation result,
wherein the expected value of the AD conversion process is based on the AD conversion result,
wherein the AD conversion process is performed a plurality of N times in succession, where N is an integer greater than or equal to 3,
wherein the method further comprises the steps of:
storing, as the expected value, the AD conversion result of the AD conversion process preceding an $(N-1)^{th}$ AD conversion process, and
when an $N^{th}$ AD conversion process is performed, generating, as the reference voltage, the AD conversion result of the AD conversion process preceding the $(N-1)^{th}$ AD conversion.

* * * * *